US 6,655,188 B2

(12) United States Patent
Knudsen et al.

(10) Patent No.: US 6,655,188 B2
(45) Date of Patent: Dec. 2, 2003

(54) METHOD AND SYSTEM FOR CALIBRATING A CONVERSION UNIT OF A FIBER OPTIC SENSOR HEAD

(75) Inventors: Sverre Knudsen, Trondheim (NO); Dag Thingbø, Trondheim (NO); Arne Berg, Kattem (NO)

(73) Assignee: Optoplan AS, Trondheim (NO)

( * ) Notice: Subject to any disclaimer, the term of this patent is extended or adjusted under 35 U.S.C. 154(b) by 0 days.

(21) Appl. No.: 10/149,069

(22) PCT Filed: Dec. 8, 2000

(86) PCT No.: PCT/NO00/00422

§ 371 (c)(1),
(2), (4) Date: Jun. 7, 2002

(87) PCT Pub. No.: WO01/42806

PCT Pub. Date: Jun. 14, 2001

(65) Prior Publication Data

US 2002/0182589 A1 Dec. 5, 2002

(30) Foreign Application Priority Data

Dec. 13, 1999 (NO) .......................................... 19996172

(51) Int. Cl.[7] .............................................. G01D 18/00
(52) U.S. Cl. .................................... 73/1.88; 356/73.1
(58) Field of Search ........................... 73/1.88; 356/475, 356/73.1; 250/227.19

(56) References Cited

U.S. PATENT DOCUMENTS

| 4,632,551 | A | * | 12/1986 | Pavlath | 356/478 |
| 4,752,132 | A | * | 6/1988 | Pavlath | 356/478 |
| 4,755,668 | A | * | 7/1988 | Davis | 250/227.27 |
| 4,770,535 | A | * | 9/1988 | Kim et al. | 356/478 |
| 4,814,706 | A | * | 3/1989 | Rempt | 324/244.1 |
| 4,896,525 | A | | 1/1990 | Breimesser | 73/1.88 |
| 5,039,221 | A | | 8/1991 | Layton et al. | 356/478 |
| 5,173,743 | A | * | 12/1992 | Kim | 356/478 |
| 6,043,648 | A | | 3/2000 | Menke et al. | 324/244.1 |
| 6,166,815 | A | * | 12/2000 | Vali et al. | 356/477 |
| 6,522,797 | B1 | * | 2/2003 | Siems et al. | 385/12 |

FOREIGN PATENT DOCUMENTS

| DE | 196 23 810 C1 | 7/1997 |
| EP | 0 423 620 A1 | 4/1991 |
| EP | 0 423 622 A1 | 4/1991 |

OTHER PUBLICATIONS

K.S. Lee, et al., "Magnetostrictive Transducers for Optical Fiber Magnetic Field Sensors", *Proceedings of the SPIE–The International Society for Optical Engineering Conference*, 1994, pp. 57–65, vol. 2292, USA (Dialog Abstract only).

* cited by examiner

*Primary Examiner*—Helen Kwok
*Assistant Examiner*—David A. Rogers
(74) *Attorney, Agent, or Firm*—Rothwell, Figg, Ernst & Manbeck

(57) ABSTRACT

Method and system for obtaining scale factor calibration of a fiber optic sensor head (3, 6) comprising a conversion unit (3) with a conversion element (14) made from a material being subject to changes in its shape or physical dimensions under the influence of magnetic or electric fields, e.g. a magnetostrictive, electrostrictive, or piezoelectric material, and an optical fiber (4) being attached to the conversion element (14), the conversion element (14) thus straining the optical fiber causing a phase and/or intensity modulation of the optical signal in the fiber when subject to the fields. The method is characterized in that a chosen electrical energy is applied to the sensor head (3, 6) resulting in a change in the optical signal being received by the optical interrogation device, and calculating a calibration signal, e.g. a calibration scale factor, based on the applied electrical energy and the measured change in the optical signal.

12 Claims, 3 Drawing Sheets

Known Art
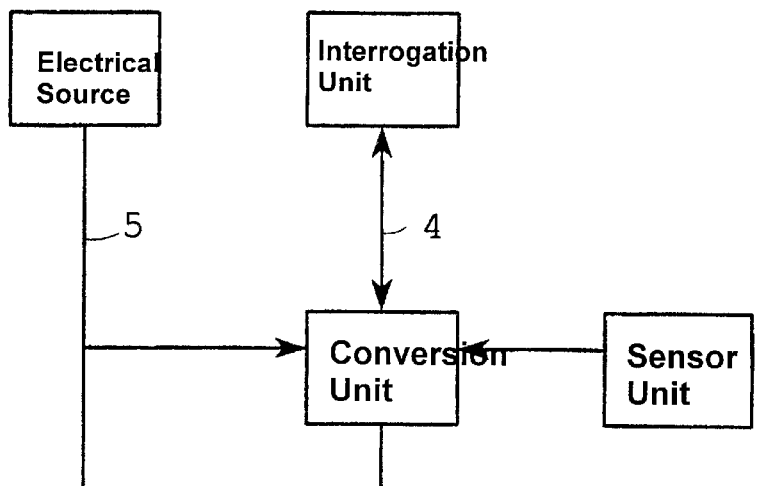
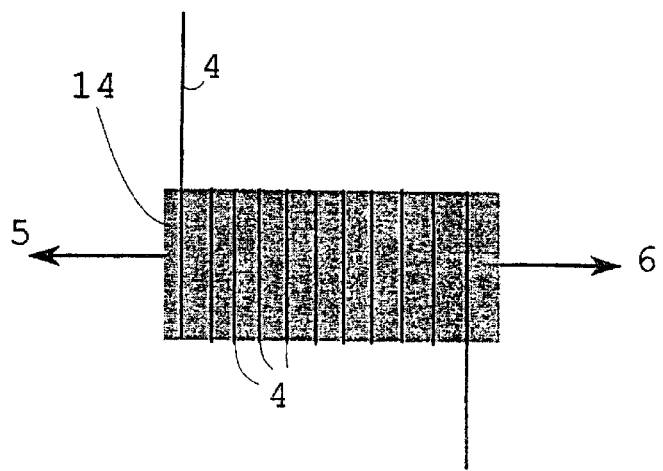

METHOD AND SYSTEM FOR CALIBRATING A CONVERSION UNIT OF A FIBER OPTIC SENSOR HEAD

BACKGROUND OF THE INVENTION

1. Field of the Invention

This patent application is related to a method for obtaining scale factor calibration of a fiber optic sensor head.

2. Description of the Related Art

Fiber optic sensors have been configured as passive devices with high sensitivity and excellent reliability in high temperature and pressure environments. For some sensors, a change or drift in scale factor of the transducer element of the fiber optic sensor can occur, and this becomes a problem if scale factor drift appears between measurements, causing errors in the measurements. A change in scale factor can occur due to changes in material properties used in the construction of the sensor element, in particular for a sensor element exposed to and used in high temperature and/or pressure environments. Therefore, it is usually desired, if possible, to perform a pre-calibration of a sensor prior to a measurement in order to determine the absolute value of the signal amplitude and phase in a particular measurement. In permanent installations of fiber optic sensors, for example downhole in oil and gas wells, the sensors cannot be retrieved and recalibrated after being installed.

SUMMARY OF THE INVENTION

The objective of this invention is to provide a method for remote calibration of the scale factor of fiber optic electromagnetic sensors, without the need for retrieving the sensors to do recalibration. In particular it is an objective to be able to remotely calibrate the scale factor of permanently installed downhole fiber optic electromagnetic sensors, e.g. fiber-optic magnetic and electric field sensors, from the surface in seismic or downhole surveying. The signal in the optical fiber in combination with a known electrical calibration signal are used to perform a calibration of the scale factor of all the individual fiber optic sensors which are forming an array. This is obtained by using a method for doing remote scale factor calibration of fiber optic electromagnetic sensors, conversion unit and system.

BRIEF DESCRIPTION OF THE SEVERAL VIEWS OF THE DRAWINGS

The invention will be described in detail below with reference to the accompanying drawings, illustrating the invention by way of examples.

FIG. 1 illustrates schematically a system according to the known art.

FIG. 2 illustrates a system employing the method and conversion unit according to the invention.

FIG. 3 shows a conversion unit according to the invention.

DETAILED DESCRIPTION OF THE PREFERRED EMBODIMENTS

Figure 4:
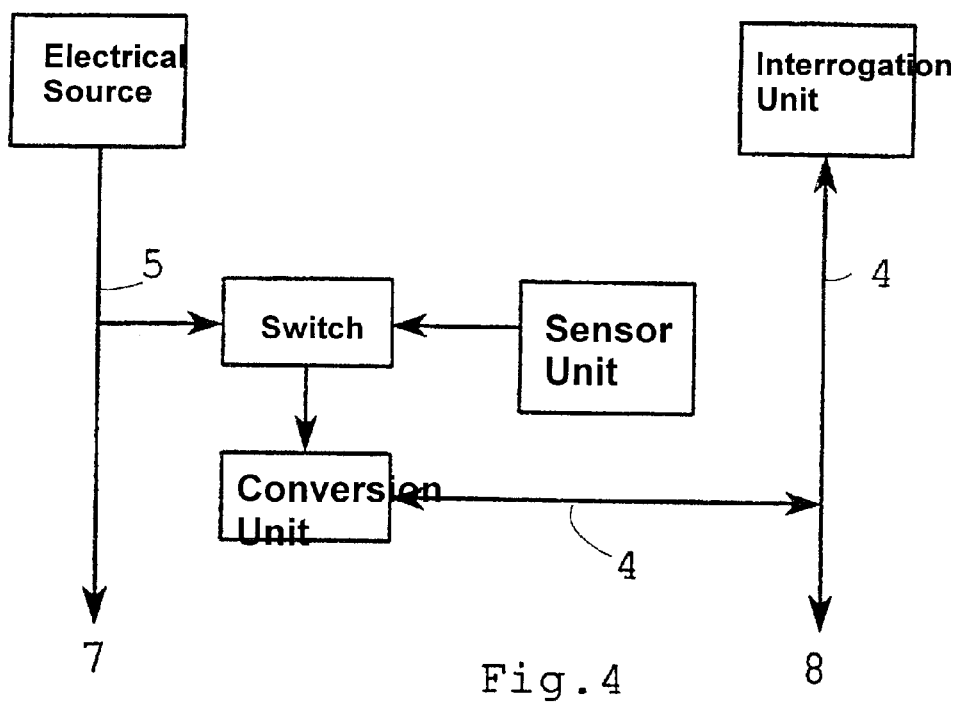
FIG. 4 illustrates an alternative embodiment of the method and system illustrated in FIG. 2.

A general diagram of a fiber-optic electrical or magnetic field sensor is shown in FIG. 1. In this case the electromagnetic field is detected by a receiver antenna or sensing unit 6 which in turn induces a voltage or current signal that is applied to the conversion unit 3. The conversion unit 3 consists of a material having properties such as piezoelectricity, magnetostriction or electrostriction. The conversion unit may have the geometrical form as a sphere, cylinder or a plate, and is assumed to be polarized or annealed so that when a signal from 6 is detected, mechanical strain is generated in the sensing portion of the optical fiber. Hence, when an optical fiber 4 is properly attached to the conversion unit 3, the strain can be measured optically either as a shift in the optical wavelength by using a Bragg grating imprinted into the fiber, as a phase shift by using a fiber interferometer or as an optical signal amplitude shift by means of the electro-optic interrogation and read out unit 2. The interrogation device forwards the measured signals to an output, such as a demultiplexing demodulator unit.

Below we describe various methods that can be utilized to remotely and individually calibrate fibre optic sensors of the kind described above.

A general illustration of the various parts required in a sensor system for obtaining remote scale factor calibration of fibre optic electrical and magnetic field sensors is shown in FIG. 2. A energy supply unit or electrical source 1 supplies electrical energy into the system in the form of known voltage and/or current signals, where signals with functions of performing calibration and/or switch triggering is expected to be supplied through the wires 5 to the conversion unit 3. The conversion unit 3, as illustrated in FIG. 3, contains a body or mechanical structure 14 having a material with such properties that the structure responds in the form of a surface mechanical strain when the structure detect an electrical current or voltage signal. When an optical fibre 4 is properly attached onto a structure with any of the above materials, the fibre 4 will also experience the surface strain of the structure and this can be measured by a change in the optical signal propagating in the fibre 4 attached onto the structure. Depending on the nature of the optical interrogation and electro-optic read out system 2, this strain change can be measured as a phase change in the optical fibre by using an interferometer, as an amplitude variation of the optical signal, or as a wavelength shift of the optical signal by using a Bragg grating imprinted into the optical fibre core.

FIG. 2 shows a single sensor head which includes a conversion unit 3 and sensor unit 6. This shows a single unit, however, several sensors of the same kind can be multiplexed using the same fibre where known calibration signals are generated by the energy supply unit 1 through the electrical wires 5. This is illustrated by the arrows 7,8 for the electrical wire(s) and optical fibre(s), respectively.

A simple example of how a calibrating conversion unit may be made is shown in FIG. 3, in which the conversion element 14 is a piezoelectric cylinder around which the optical fibre 4 is wound. In addition to the conductor transmitting signals from the sensor 6, the conversion element is in this example also connected to an energy source through a separate conductor 5. Depending on the material, shape and dimensions of the converter element 14 the details concerning how the calibration signal from the supply unit 1 through the wires 5 are coupled are omitted for clarity, however, known art electrical circuitry can be applied for optimization.

The calibration may be performed in several alternative ways. In FIG. 4 a method is shown for remotely calibration of fibre optic magnetic and electric field sensors 6, using a switch 9 between the calibration and sensing wires using the optical fibre 4 to read out the scale factor information. The switch connects either the calibration signal or the sensor signal to the conversion unit 3. The calibration signal is applied by providing a calibration signal of known amplitude to the electrical wires 5 using a signal generator 1, the phase and amplitude of the signal by using a fibre optic interferometer can be measured by 2, and therefore a scale factor calibration is obtained. When the sensor unit 6 is connected to the conversion unit 3 the electrical wires 5 are disconnected and the strain in the optical fibre attached onto the fibre optic conversion unit 3, which include an electromechanical transducer, 3 is induced by the electromagnetic sensing field which is picked up by the sensing unit 6, thus providing a measure of the electromagnetic signal by combining the signal scale factor with the reference signal from the supply unit 1.

Figure 5:
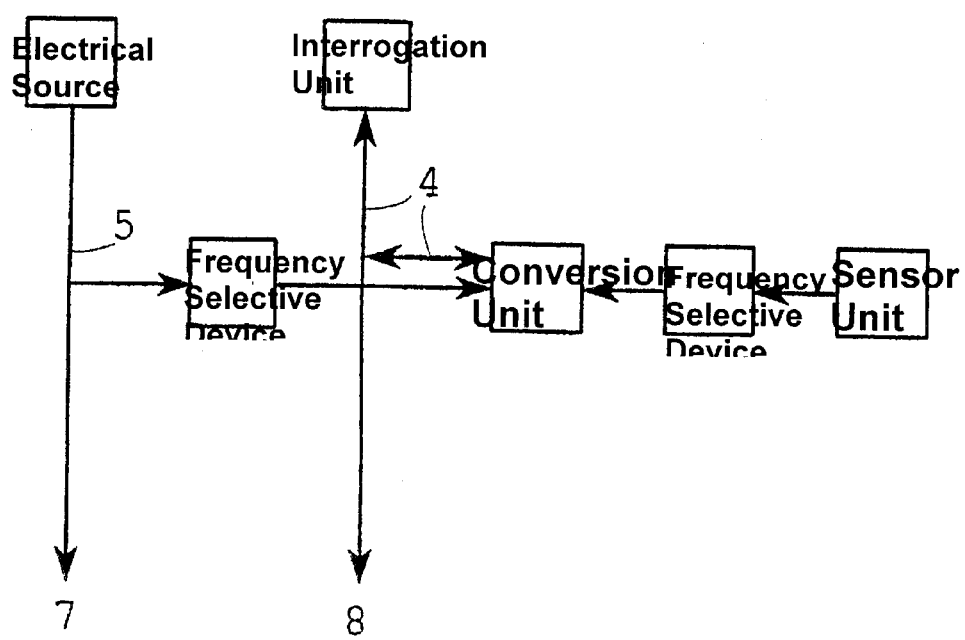
FIG. 5 illustrates a second alternative embodiment of the invention.

FIG. 5 illustrates a method using a frequency selective network to discriminate between the sensing signal induced by the receiver unit 6 and the known calibration signals generated by 1. In this case, it is assumed that the sensing and calibration signals have different frequencies. Frequency selective devices 10,15 are connected to the sensor 6 and energy source 1 so as to the sensor or calibration signals to the conversion unit 3. At the interrogation device 2 signal may be filtered to separate the calibration and measurement signals.

Figure 6:
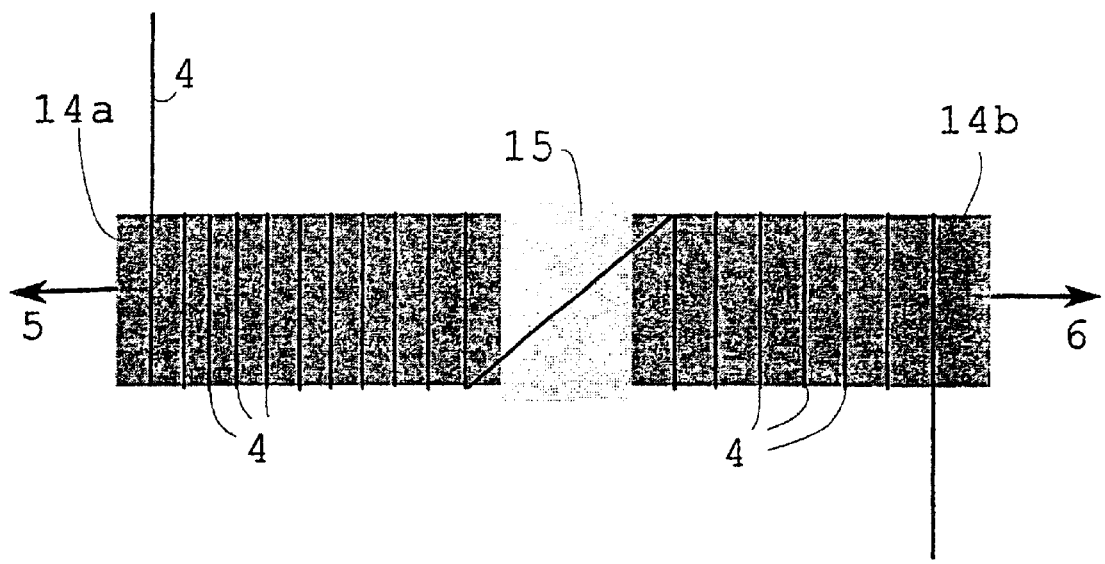
FIG. 6 shows an alternative conversion unit according to the invention.

A special transducer in the conversion unit 3 where the conversion element is comprised by a split fibre wrapped piezoelectric transducer is shown in FIG. 6. A remote scale factor calibration is in this case obtained as the optical fibre 4 is equally distributed and coupled to the two different sections 14a, 14b of the transducer 14, which is an electrode split design where one the two parts is connected to the sensor unit 6 while the other part to the electrical wires 5, and thus the known calibration signal transmitted from the supply unit 1.

For convenience, FIG. 6 shows a split mandrel electrode design, however this method also applies to other geometries such as spheres, plates and beams.

Figure 7:
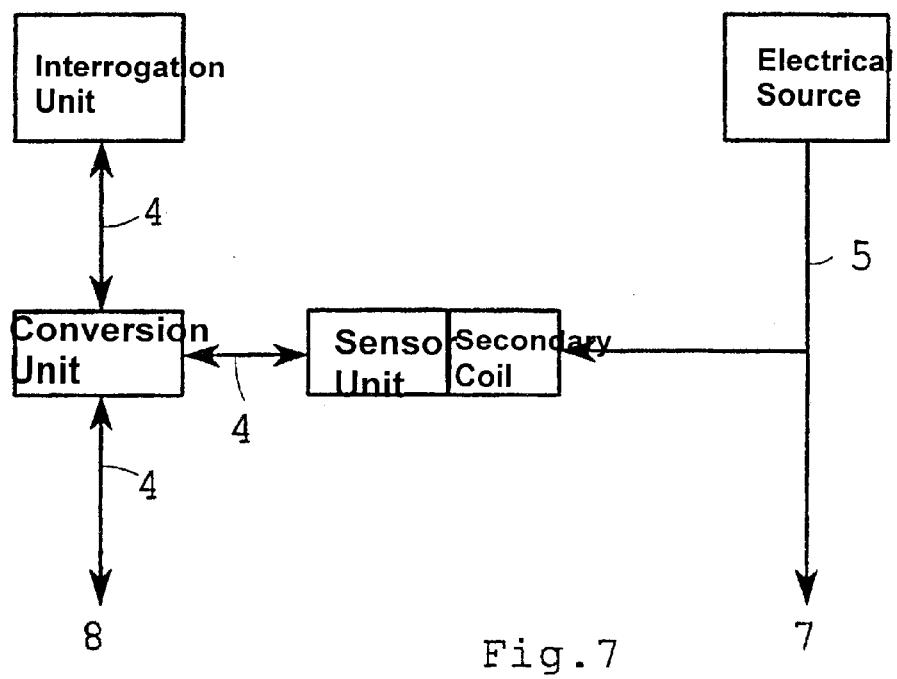
FIG. 7 illustrates a method and system according to the invention employing the conversion unit shown in FIG. 6.

FIG. 7 shows a method for remotely calibrate fibre optic electromagnetic field sensors by using a secondary coil 16 to drive the sensor unit 6 with a known electromagnetic field. This may be performed by using an electromechanical magnet arranged to generate a known calibration signal for the sensor unit or simply a secondary coil arrangement. The known response of the sensor unit 6 is then converted in the conversion unit 3.

A permanent magnet can also be used an electromagnetic reference signal to bias the conversion unit by a known electromagnetic signal.

Fibre optic electric and/or magnetic field sensors for in-well formation resistivity measurements in oil and gas exploration. The sensors are based on a fibre attached properly to a structure that has a strain response when subjected to an electromagnetic field. The structure is expected to be based on materials having properties with electrostrictive, magnetostrictive, or piezoelectric effect, where calibration and sensing signals are electrical voltage and/or electric current signals induced in some manner such as by induction.

The optical fibre and a calibration signal can be used exclusively to perform pre-calibrations of the scale factor for electrical, magnetic and seismic sensor heads based on electrostrictive, magnetostrictive, or piezoelectric materials.

As mentioned above the drawings show examples of possible embodiments of the invention. Also they are simplified for the sake of illustration, so that other energy sources for the different parts of the system are not shown, e.g. power supply for the sensor, filters, switches etc. This parts may be of any available type and are therefore not described in any detail here.

What is claimed is:

1. Method of obtaining scale factor calibration of an electro-optic conversion unit in a fibre optic sensor head, the sensor comprising in the conversion unit in the sensor head a conversion element and associated electrical conductors for creating electric or magnetic fields, an optical fibre being attached to the conversion element, an electro-optical interrogation and read-out device, the conversion element being at least partly made from material(s) which causes the shape or physical dimensions of the element to change when subjected to said fields thus straining the fibre and providing a phase and/or intensity modulation of an optical signal in the fiber, the optical signal being detectable in the electro-optical interrogation readout device, characterized in applying electric signals produced in a sensing unit to the electrical conductors of the conversion unit, thus producing said electric and magnetic fields, applying a chosen electric reference or calibration signal to the electric conductors of the conversion element by means of an electric supply unit, also producing said electric and magnetic fields, using the resulting optical signals received by the interrogation and read-out device to calculate a calibration scale factor related with the conversion element.

2. Method according to claim 1,
characterized in applying the calibration signal at in chosen periods of time so as to provide calibration signals in these periods.

3. Method according to claim 1,
characterized in applying the calibration signal at chosen frequencies being different from the expected frequencies of the signal produced in the sensing unit, so as to distinguish the calibration signal from the signal cause by the measured disturbances.

4. Method according to claim 1,
characterized in applying the signal from the sensing unit to one of two adjacent, essentially identical and mutually insulated conversion elements being attached to the same fibre, and applying a calibration or reference signal to the other of the two conversion elements.

5. Method according to claim 1,
characterized in that the electric energy source is coupled to a sensor unit in said sensor head to provide a controlled sensor signal by inducing a response in sensor unit, the controlled sensor signal being converted by the conversion unit.

6. Method according to claim 1,
characterized in that said material is selected from the group consisting of magnetostrictive, electrostrictive, and piezoelectric materials.

7. Electro-optic sensor system having a sensor head, said sensor head having an electro-optic conversion unit with scale factor calibration, the sensor head comprising in the conversion unit in the sensor head a conversion element and associated electrical conductors for creating electric or magnetic fields, an optical fibre being attached to the conversion element an electro-optical interrogation and read-out device;

the conversion element being at least partly made from material(s) which causes the shape or physical dimensions of the element to change when subjected to said fields thus straining the fibre and providing a phase and/or intensity modulation of the an optical signal in the fiber, and the optical signal being detectable in read-out device characterized in that the sensing unit is adapted for generating electric signals and applying said signals to the electrical conductors of the conversion unit thereby producing said electric and magnetic fields, an electric supply unit is adapted for generating a chosen electric calibration signal and applying said calibration signal to the electric conductors of the conversion element thereby also producing said electric and magnetic fields, the interrogation and read-out device is adapted, e.g. with computer means to use the resulting received optical signals to calculate a calibration scale factor related with the conversion element.

8. System according to claim 7 characterized in that the electric supply unit and the sensor unit is connected to a switch for alternating connection of the source and sensor unit to the conversion unit the optical interrogation device thus measuring the calibration signal and the sensor signal at alternating periods of time.

9. System according to claim 7, characterized in comprising a frequency selective network connected to the electric supply unit and the sensor unit for providing simultaneous calibration and sensor signals, respectively, to the conversion unit, and that the optical interrogation device comprises filtering means for separating the calibration and sensor signals.

10. System according to claim 7, characterized in that the electric supply unit is coupled to the sensor unit for stimulating the sensor unit at chosen periods of time so as to provide a controlled, measured signal and thus to obtain a calibration signal from the sensor unit and the conversion unit simultaneously.

11. System according to claim 7, for resistivity measurements in oil or gas exploration, characterized in comprising at least two optically multiplexed sensor heads each being provided with calibration means for applying a chosen electrical energy on the sensor for detecting the resulting changes in the optical signal and for performing calibrations of the scale factor for the conversion units.

12. System according to claim 7 characterized in that said material is selected from the group consisting of magnetostrictive, electrostrictive, and piezoelectric materials.

* * * * *